(12) United States Patent
Kasai

(10) Patent No.: US 8,552,652 B2
(45) Date of Patent: Oct. 8, 2013

(54) LIGHTING DEVICE, MANUFACTURING METHOD THEREOF, AND ELECTRONIC APPARATUS

(75) Inventor: Toshiyuki Kasai, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 139 days.

(21) Appl. No.: 13/316,071

(22) Filed: Dec. 9, 2011

(65) Prior Publication Data
US 2012/0153831 A1    Jun. 21, 2012

(30) Foreign Application Priority Data

Dec. 21, 2010    (JP) .................................. 2010-284263

(51) Int. Cl.
*H05B 37/02*    (2006.01)
(52) U.S. Cl.
USPC ......................................................... 315/121
(58) Field of Classification Search
None
See application file for complete search history.

(56) References Cited

U.S. PATENT DOCUMENTS

| | | | |
|---|---|---|---|
| 5,006,908 A * | 4/1991 | Matsuoka et al. | 257/76 |
| 7,675,087 B1 * | 3/2010 | Cheng et al. | 257/99 |
| 7,973,324 B2 * | 7/2011 | Cheng et al. | 257/81 |
| 2005/0104508 A1 | 5/2005 | Ozawa et al. | |
| 2008/0129179 A1 | 6/2008 | Peeters et al. | |

FOREIGN PATENT DOCUMENTS

| | | |
|---|---|---|
| JP | A-2004-234868 | 8/2004 |
| JP | B2-3783709 | 6/2006 |
| JP | B2-3867698 | 1/2007 |
| JP | A-2007-115629 | 5/2007 |
| JP | A-2009-187774 | 8/2009 |
| JP | A-2011-60680 | 3/2011 |

* cited by examiner

*Primary Examiner* — Crystal L Hammond
(74) *Attorney, Agent, or Firm* — Oliff & Berridge, PLC

(57) ABSTRACT

A lighting unit includes, a plurality of light emitting elements which has a first substrate, a supporting electrode, light emitting functional layers, first electrodes, and a second electrode; a plurality of fuse units,; an insulating first partitioning wall which separates each of the light emitting functional layers from each other, and each of the first electrodes from each other; and an insulating second partitioning wall which separates each of fuse units from each other. One of the plurality of fuse units electrically connects one of the first electrodes and the supporting electrode.

18 Claims, 7 Drawing Sheets

LIGHTING DEVICE, MANUFACTURING METHOD THEREOF, AND ELECTRONIC APPARATUS

BACKGROUND

1. Technical Field

The present invention relates to a lighting device which includes a luminous element such as an organic EL (Electroluminescence) element or the like, the manufacturing method thereof, and an electronic apparatus including the device.

2. Related Art

In recent years, a lighting device which includes an organic EL element has been developed. Since the thickness of the light-emitting layer of the organic EL element, which is a self-luminous element, is extremely thin, it is possible to make the lighting device light and thin when the organic EL element is applied to the lighting device. In addition, since the organic EL element is able to emit light of high luminance in a low voltage, it is also possible to achieve power savings in the lighting device. In this manner, since it is possible to make the lighting device in which the organic EL element is used thin and be able to save electric power, the lighting device may be also mounted in a liquid crystal display or portable device which needs to be thin and light, in addition to lighting device such as a lamp.

The organic EL element is configured by a light emitting functional layer and two electrodes, a positive electrode and a negative electrode, which pinch the light emitting functional layer from both sides. However, when the light emitting functional layer deteriorates with time, or a conductive foreign substance enters the light emitting functional layer in the manufacturing process, there is a possibility of a short circuit occurring between the two electrodes.

In JP-A-2004-234868, since a plurality of light emitting elements is connected in series, it is possible to make a current continuously flow to the other organic EL element, even if a short circuit occurs in one organic EL element.

However, since a high power supply voltage is necessary for the lighting device in which the plurality of organic EL elements is connected in series as in JP-A-2004-234868, it is necessary to configure a power supply unit using a more pressure resistant element. In addition, when disconnection occurs in the lighting device, there is a problem in that in the lighting device in which the plurality of organic EL elements is connected in series, the entire lighting device is influenced by the disconnection and is turned off.

SUMMARY

Thus, an advantage of some aspects of the invention is to provide a lighting device in which a short circuit is prevented and which is able to perform stable light emitting.

According to an aspect of the invention, there is provided a lighting device having a plurality of light emitting elements. The lighting device includes a first substrate, a supporting electrode to which a first source electric potential is supplied, a plurality of light emitting functional layers, a plurality of first electrodes, a second electrode to which a second source electric potential is supplied, a plurality of fuse units, each of the plurality of fuse units electrically connecting one of the first electrodes and the supporting electrode, an insulating first partitioning wall which separates each of the plurality of light emitting functional layers from each other, and separates each of the plurality of first electrodes from each of the plurality of light emitting elements, and an insulating second partitioning wall which separates each of the plurality of fuse units.

In the above described lighting device, the plurality of light emitting elements which is separated by the insulating first partitioning wall is included. When it is assumed that the lighting device is formed of a single light emitting element, and when a part of the light emitting element is defective due to deterioration with time or entering of a foreign substance in the manufacturing process, the defect expands in the light emitting element, and the entire lighting device is unable to emit light.

On the contrary, in the above described lighting device, since the plurality of light emitting elements is formed to be separated, the defect is limited into one single light emitting element, and it is possible to maintain lighting in the other light emitting element, even if the defect occurs and expands in one light emitting element. That is, the function as a surface light source of the lighting device is not impeded due to a defect in one light emitting element. In this manner, there is an advantage that it is possible to obtain a longer life of the lighting device.

In addition, in the above described lighting device, the first electrode of the light emitting element and the supporting electrode are electrically connected to each other through a fuse unit. Since the fuse unit is fused or the like when an over-current flows in the light emitting element, and disconnects electrically the supporting electrode from the first electrode, there is an advantage that an occurrence of a short circuit in the light emitting element is prevented. In this manner, it is possible to prevent unnecessary power consumption, and to prevent all the light emitting elements from being unable to emit light due to the short circuit. That is, it is advantageous that the above described lighting device attains an even longer life due to having the fuse unit.

Further, the above described lighting device, has an advantage of using a lower voltage, since the light emitting elements are connected in parallel with respect to the supporting electrode and the second electrode.

In addition, in the above described lighting device, it is preferable that each of the plurality of fuse units be formed on the supporting electrode in a one-to-one correspondence with each of the plurality of first electrodes.

In this case, there is an advantage that it is possible to minimize the influence due to the defect, since the light emitting element which is unable to emit light is limited to the light emitting element which is connected to the disconnected fuse unit, even when the over-current flows in the light emitting element, and the fuse unit is disconnected.

In addition, in the above described lighting device, it is preferable that each of the plurality of fuse units be formed on the supporting electrode corresponding to two or more light emitting elements f the plurality of light emitting elements.

In this case, since the number of fuse units is half the number of light emitting elements, there is an advantage that it is possible to manufacture the lighting device easily.

Further, in the above described lighting device, it is preferable that all of the plurality of fuse units are overlapped with one of the plurality of light emitting functional layers when seen from a direction which is perpendicular to the first substrate.

In this case, there is an advantage that it is possible to more reliably cause a short circuit to occur in the lighting device, since it is possible to form the fuse unit and the light emitting functional layer to reliably correspond to each other.

In addition, in the above described lighting device, it is preferable that the plurality of fuse units, the supporting electrode, and the plurality of first electrodes are formed of the same material.

According to the aspect of the invention, there is an advantage that it is possible to manufacture the lighting device, since the fuse unit, the supporting electrode, and the first electrode are formed of the same material.

In addition, in the above described lighting device, it is preferable that the first substrate, the supporting electrode, the second partitioning wall, and the plurality of first electrodes are formed of a light transmissive material.

In this case, light emitted by the light emitting functional layer transmits the first electrode, the supporting electrode, the second partitioning wall, and the first substrate, and is emitted to the outside from the first substrate.

In addition, in the above described lighting device, it is preferable that the plurality of fuse units is formed of the light transmissive material.

In this case, there is an advantage that utilization efficiency of light is improved, since the light emitted by the light emitting functional layer is emitted to the outside from the first substrate without being obstructed by the fuse unit.

Further, in the above described lighting device, it is preferable that the first substrate and the second electrode be formed of the light transmissive material.

In this case, there is an advantage that the utilization efficiency of light is improved, since the light emitted by the light emitting functional layer is emitted to the outside passing through only the second electrode and the first substrate.

In addition, in the above described lighting device, it is preferable that the plurality of light emitting elements be connected to the supporting electrode in parallel.

In this case, there is an advantage that it is possible to realize a lowered voltage for the above described lighting device.

Subsequently, according to another aspect of the invention, there is provided an electronic apparatus which includes any one of the above described lighting device. As such an electronic apparatus, for example, there is device such as a lamp or the like, or device which includes the above described lighting device as a backlight, such as a personal computer and a mobile phone. In the electronic apparatus, it is possible to realize a smaller and lighter apparatus, since the lighting device can be made thinner and lighter.

BRIEF DESCRIPTION OF THE DRAWINGS

The invention will be described with reference to the accompanying drawings, wherein like numbers reference like elements.

DESCRIPTION OF EXEMPLARY EMBODIMENTS

A: First Embodiment

Figure 1:
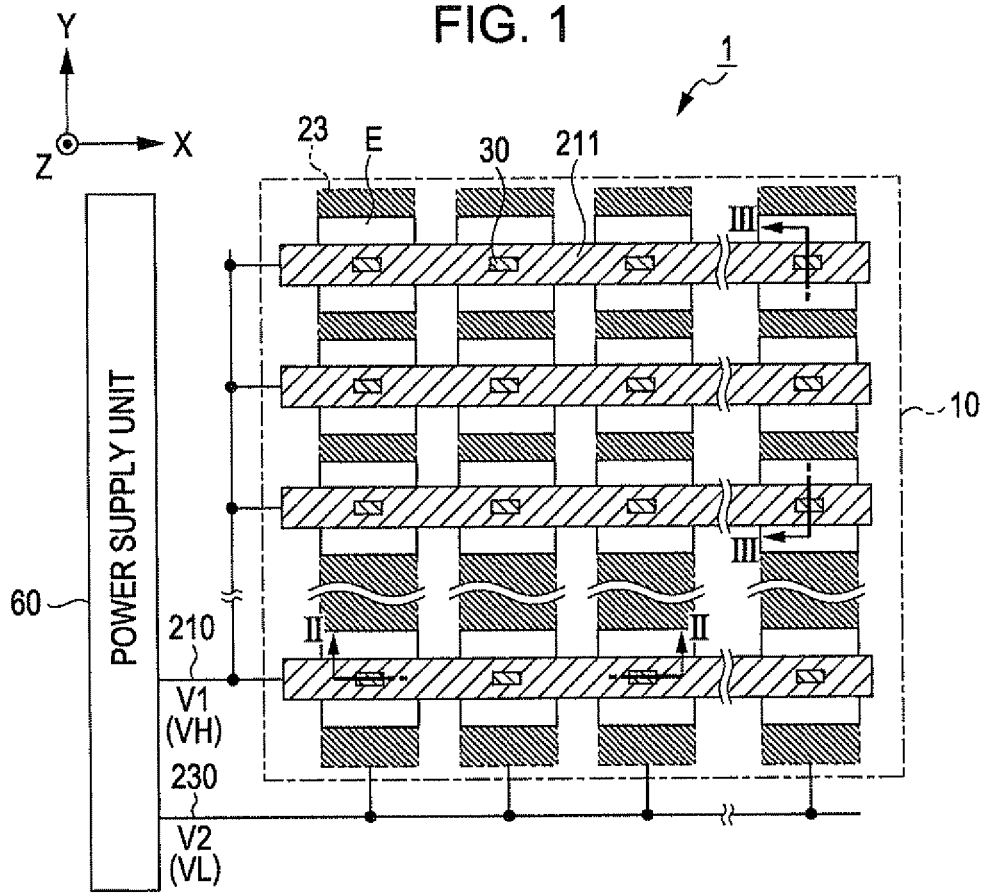
FIG. 1 is a plan view which shows a lighting device according to a first embodiment of the invention.

Hereinafter, various embodiments according to the invention will be described with reference to accompanying drawings. In the drawings, the ratio of a size of each unit will be appropriately differentiated from the real unit.

FIG. 1 is a plan view which shows a lighting device 1 according to an embodiment of the invention.

As shown in FIG. 1, the lighting device 1 includes a lighting unit 10 and a power supply unit 60.

The lighting unit 10 is formed of M supporting electrodes 211 which extend in the X direction and N second electrodes 23 which extend in the Y direction which intersects the X direction, and light emitting elements E which correspond to intersections of the M supporting electrodes 211 and the N second electrodes 23, and are arranged in a matrix of vertical M rows × horizontal N rows (here, M and N are natural numbers of one or more).

A power supply unit 60 supplies a first electric potential V1 to the supporting electrode 211 through a first power line 210, and supplies a second electric potential V2 to the second electrode 23 through a second power line 230. According to the first embodiment, the first electric potential V1 is set to a high electric potential VH, and the second electric potential V2 is set to a low electric potential VL.

Figure 2:
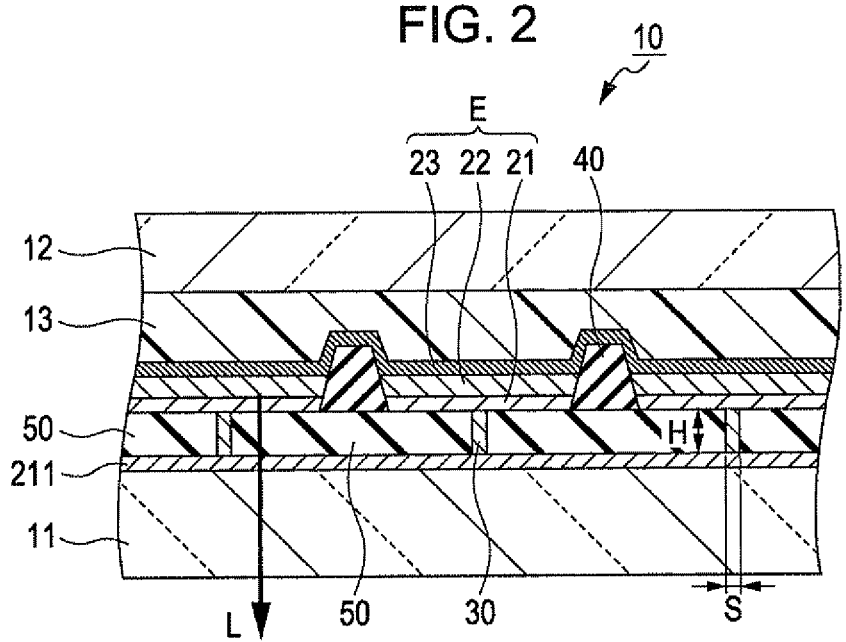
FIG. 2 is a cross-sectional view which shows a structure of the lighting device according to the first embodiment of the invention.
Figure 3:
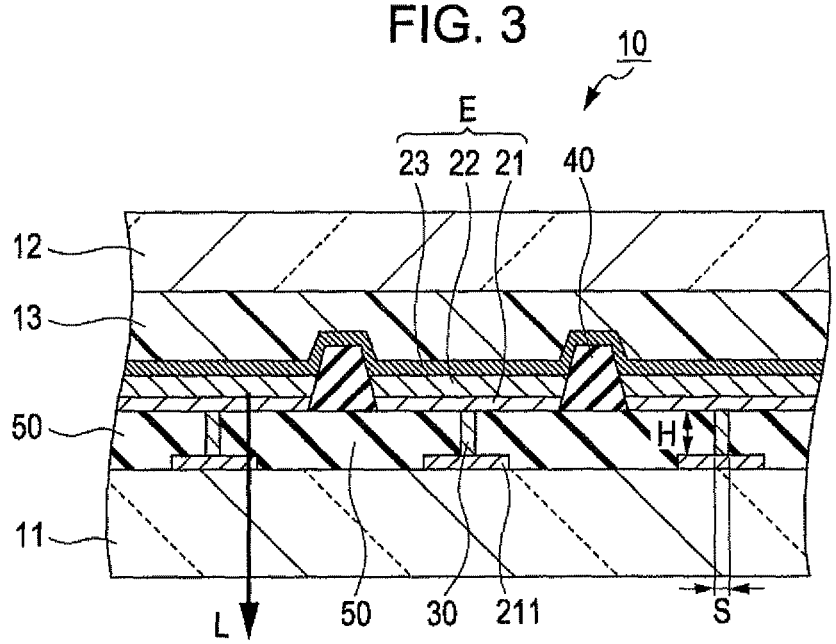
FIG. 3 is a cross-sectional view which shows the structure of the lighting device according to the first embodiment of the invention.

FIG. 2 is a cross-sectional view which shows the lighting unit 10 shown in FIG. 1 which is cut along line II-II, and FIG. 3 is a cross-sectional view which shows the lighting device 1 shown in FIG. 1 which is cut along line III-III. Hereinafter, a structure of the lighting unit 10 will be described with reference to FIGS. 2 and 3.

The lighting unit 10 emits light, which is emitted by the light emitting element E, to the lower part of FIG. 2, that is, in the direction L, from the light emitting element E to a first substrate 11. The lighting unit 10 functions as lighting device of a bottom emission-type. The lighting unit 10 includes the light emitting element E having a first electrode 21, a light emitting functional layer 22, and the second electrode 23, the first substrate 11 in which the supporting electrode 211 or the like is formed, and a second substrate 12 which seals these light emitting elements or the like. The first substrate 11 is formed of a material with optical transparency such as glass, quartz, plastic, or the like. The supporting electrode 211 is formed on the first substrate 11. The supporting electrode 211 is formed of a conductive oxide material with optical transparency such as ITO (indium tin oxide), IZO (indium zinc oxide), or $ZnO_2$, similarly to the first electrode 21 to be described later.

A fuse unit 30 is formed on the supporting electrode 211 in a one-to-one correspondence with the light emitting elements E. That is, the fuse unit 30 is arranged in matrix of vertical M rows×horizontal N rows corresponding to the intersections of the M supporting electrodes 211 and N second electrodes 23. The fuse unit 30 is formed at a position where the entire fuse unit is covered with the light emitting element E when seen from a direction which is perpendicular to the first substrate 11.

The supporting electrode 211 and the first electrode 21 are electrically connected through the fuse unit 30. In this manner, the fuse unit 30, the first electrode 21, and the light emitting functional layer 22 are connected in series.

In addition, the first electric potential V1 is supplied to the first electrode 21 through the supporting electrode 211, and as described above, the second electric potential V2 is supplied to the second electrode 23. That is, in the first embodiment, the first electric potential V1 functions as the anode, and the second electrode 23 functions as the cathode.

When an over-current flows in the fuse unit 30, there occurs fusing due to the heat, or electro-migration, and the fuse unit 30 is in a non-conduction state.

Accordingly, when the over-current flows in the light emitting element E, the fuse unit 30 which is connected in series to the light emitting element E is disconnected, the supporting electrode 211 and the first electrode 21 which are electrically connected through the fuse unit 30 are electrically disconnected. In this manner, it is possible to prevent a short circuit of the light emitting element E, that is, to prevent the short circuit from occurring between the supporting electrode 211 which supplies the high electric potential VH and the second electrode 23 which supplies the low electric potential VL.

The fuse unit 30 has a large electric resistance compared to the first electrode 21 and the light emitting functional layer 22 which are connected to the fuse unit 30 in series. When a current flows in the light emitting element E, since a current of the same magnitude flows in the fuse unit 30. The first electrode 21 and the light emitting functional layer 22, a large amount of heat generates in the fuse unit 30 with a large electric resistance, compared to the first electrode 21 and the light emitting functional layer 22. Due to the heat, fusing or the like occurs in the fuse unit 30, and the fuse unit 30 is disconnected.

The fuse unit 30 with the large electric resistance is formed of a material with high resistivity, and is formed in a shape with high resistivity. The detailed shape of the fuse unit 30 is that, for example, the height H in the direction perpendicular to the first substrate 11 is high, the cross-sectional area S in a cross-section which is parallel to the first substrate 11 of the fuse unit 30 is small, and has a shape of a thin and long column, a prism, or the like.

In addition, since the fuse unit 30 is positioned at the emitting surface side of light which is emitted from the light emitting element E, it is formed of a material with optical transparency. In detail, the fuse unit 30 according to the first embodiment is formed of polysilicon.

Since the fuse unit 30 is formed of a material which is different from ITO or the like which forms the supporting electrode 211 and the first electrode 21, the fuse unit 30 can be reliably and easily separated from the supporting electrode 211 or the first electrode 21, even when the fuse unit 30 is fused at a position close to the connection portion with the supporting electrode 211 or the first electrode 21 in the fuse unit 30. That is, it is possible to reduce the possibility of the fuse unit 30 bonding again due to residual heat or the like after fusing compared to the case where the fuse unit 30 is formed by the same material as the supporting electrode 211 or the first electrode 21, and reliably prevent the occurrence of a short circuit.

A second partitioning wall 50 is formed on the first substrate 11 and the supporting electrode 211 such that each of the M supporting electrodes 211 is separated, and each of the M×N fuse units 30 is separated. The second partitioning wall 50 is formed of an insulating material with optical transparency such as acryl, polyimide, or the like. The second partitioning wall 50 prevents a given fuse unit 30 from being short circuited with a neighboring fuse unit 30.

The light emitting element E is provided on the fuse unit 30 and the second partitioning wall 50 in a one-to-one correspondence with the fuse units 30. The light emitting element E includes the first electrode 21 as the anode, the light emitting functional layer 22, and the second electrode 23 as the cathode.

The first electrode 21 is formed on the fuse unit 30 and the second partitioning wall 50 so as to come into contact with the first partitioning wall 40. The first electrode 21 is formed of the conductive oxide material with optical transparency such as ITO (indium tin oxide), IZO (indium zinc oxide), or $ZnO_2$.

The light emitting functional layer 22 is formed on the first electrode 21 so as to come into contact with the first partitioning wall 40. The light emitting functional layer 22 includes at least a light-emitting layer, and the light-emitting layer is formed of an organic EL material in which positive holes and electrons are bonded and emit light. According to the first embodiment, the organic EL material is a low molecular material. As other layers which configure the light emitting functional layer 22, a part or the whole of an electron blocking layer, a positive hole-injection layer, a positive hole transport layer, an electron transport layer, an electron-injection layer, and a hole blocking layer may be included.

The second electrode 23 is formed on the light emitting functional layer 22 and the first partitioning wall 40 so as to be common to the M light emitting elements E which are extended in the Y axis direction. The second electrode 23 is formed of a reflective metal material with small value of work function such as aluminum or silver. The second electrode 23 functions as the cathode of the light emitting element E, and functions as a reflective plate which reflects light which is emitted from the light emitting functional layer 22 in the opposite direction to the direction L to the direction L toward the first substrate 11 side.

The first partitioning wall 40 which separates each of the plurality of first electrodes 21 and each of the plurality of light emitting functional layers 22 is formed on the second partitioning wall 50. The first partitioning wall 40 is formed of an insulating material. In addition, the first partitioning wall may be formed of a reflective material, and may be formed of a material with optical transparency.

The first partitioning wall 40 prevents the short circuit from occurring between two neighboring first electrodes 21. That is, each of the M×N light emitting elements E is in a relationship of parallel connection, respectively. More specifically, the plurality of light emitting elements is connected in parallel to the supporting electrode 211.

The second substrate 12 is formed of plastic, glass, or the like. The second substrate 12 is bonded to the second electrode 23 which is formed on the first substrate 11 using an adhesive 13. The adhesive 13 is a resin of a thermosetting resin, a UV-curable resin, or the like. The second substrate 12 and the adhesive 13 seal the light emitting element E or the like formed on the first substrate 11, and protects the light emitting element E from moisture, oxygen, or the like.

In addition, according to the first embodiment, since the lighting device is a bottom emission type which emits light to the direction L as described above, it is not necessary to form the second substrate 12 and the adhesive 13 of the material with optical transparency. In addition, since the light emitted from the light emitting element E is reflected by the second electrode 23 which is formed of reflective metal, it is not necessary to form the second substrate 12 and the adhesive 13 of light reflective material. However, when it is necessary to prevent light from emitting in the opposite direction to the direction L, one side surface of the second substrate 12 may be formed of low-reflective material such as chromium oxide.

In this manner, the lighting device 1 according to the first embodiment has the plurality of light emitting elements E in the lighting unit 10, and each of the light emitting elements E is separated by the insulating first partitioning wall.

If it is assumed that the lighting unit is formed of a single light emitting element, the entire lighting device is unable to emit light since a defect expands in the light emitting element, when a part of the light emitting element is defective due to deterioration with time of the light emitting element, or entering of a foreign substance in the manufacturing process of the light emitting element.

Compared to this, since the lighting unit 10 according to the first embodiment is formed such that the plurality of the light emitting element E is separated, the defect stays in one light emitting element, and the other light emitting element maintains lighting, even when the defect occurs in one light emitting element E, and expands. That is, the function of the lighting unit 10 as the surface light source is not impeded due to the defect in one light emitting element E. In this manner, the lighting device 1 according to the first embodiment has an advantage of longer life.

In addition, the lighting device 1 according to the first embodiment has the plurality of the light emitting elements E which is connected in parallel to the supporting electrode 211 and the second electrode 23, and a fuse unit 30 is provided corresponding to each of the light emitting elements E. Since the fuse unit 30 is fused or the like when the over-current flows in the light emitting element E due to a defect of the light emitting element E, and disconnects electrically the supporting electrode 211 from the first electrode 21, the occurrence of a short circuit in the light emitting element E is prevented.

In this manner, it is possible to prevent unnecessary power consumption due to the short circuit, or to prevent all the light emitting elements from being in a non-luminescent state due to the short circuit. That is, there are some advantages that it is possible to maintain the function of the lighting device 1 as the surface light source for a long time, and to lengthen the life of the lighting device 1. In addition, since the plurality of light emitting elements E is connected in parallel to the supporting electrode 211 and the second electrode 23, there is an advantage that it is possible to the lower voltage of the lighting device 1.

Further, the fuse unit 30 is formed of polysilicon, which is a material different from ITO or the like which forms the supporting electrode 211 and the first electrode 21 to which the fuse unit 30 is connected. In this manner, since the fuse unit is prevented from being bonded again due to residual heat after the fusing, even when the fuse unit 30 is fused at a position close to the connection portion with the supporting electrode 211 or the first electrode 21 in the fuse unit 30, there is an advantage that it is possible to reliably prevent the occurrence of a short circuit.

The lighting device 1 according to the first embodiment forms the light emitting element E after forming the fuse unit 30 or the like. That is, since the lighting unit 10 is formed only by bonding the first substrate 11 on which the light emitting element E or the like is formed and the second substrate 12 using the adhesive 13, after forming the light emitting element E on the first substrate 11, it is possible to reduce the danger of damaging the light emitting element E in the manufacturing process which is necessary to be protected especially from water, the air outside, and entering of foreign substances. Accordingly, in the lighting device 1 according to the first embodiment, there are some advantages that it is possible to easily manufacture the lighting device, and to improve the yield during manufacturing.

In addition, the lighting unit 10 according to the first embodiment is configured by including N second electrodes 23 which is extended in the Y direction as shown in FIG. 1, however, the invention is not limited thereto.

Figure 4:
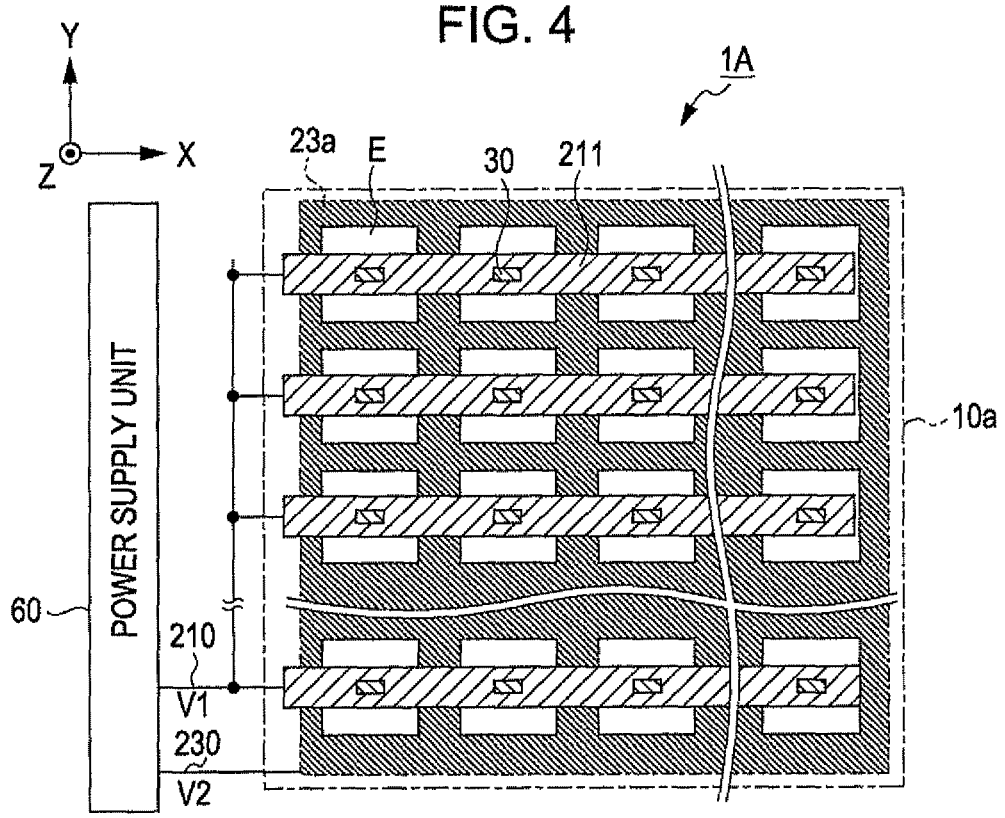
FIG. 4 is a plan view which shows the lighting device according to a modified example of the first embodiment of the invention.

For example, like a lighting unit 10a shown in FIG. 4, a second electrode 23a which is common to all the light emitting elements E may be provided. In this case, the formation of the second electrode 23a in the manufacturing process is simplified, accordingly, there is an advantage that it is possible to reduce the cost of the lighting device 1. In addition, since the area of the second electrode 23a become large, there is an advantage that it is possible to reduce the resistance value of the second electrode 23, and to realize low power consumption of the lighting device.

In addition, according to the first embodiment of the invention, the fuse unit 30 is formed of polysilicon, however, the invention is not limited thereto.

For example, the fuse unit 30 may be formed of ITO or the like which is the same material as that of the supporting electrode 211 and the first electrode 21, In this case, since all of the fuse unit 30, the supporting electrode 211, and the first electrode 21 are formed of the same material, there is an advantage that it is possible to reduce the manufacturing cost of the lighting device 1.

In addition, even if the fuse unit 30 is formed of the same material as that of the supporting electrode 211 and the first electrode 21, it is possible to raise the resistance value of the fuse unit 30 by sufficiently minimizing the cross-sectional area S of the fuse unit 30, and to reliably prevent the occurrence of a short circuit due to the reliable fusing of the fuse circuit 30 when the over-current occurs.

Further, the fuse unit 30 may be configured by the low melting point metal. In this case, since the fuse unit 30 has a low melting point, it is possible to cause the fuse unit 30 to fuse before the magnitude of the current which flows in the light emitting element E becomes extremely large.

In addition, since the metal has low resistivity, it is possible to make the cross-sectional area S of the fuse unit 30 small compared to a case where the polysilicon or ITO is used in the fuse unit 30. For this reason, it is possible to form the fuse unit 30 of a material with no optical transparency, since the ratio of light, which passes through the fuse unit 30 among the light which is emitted to the direction L from the light emitting element E, is small.

B: Second Embodiment

Lighting device 1B according to a second embodiment has the same configuration as that of the lighting device 1 according to the first embodiment, except that the lighting device 1B has a lighting unit 10b including a fuse unit 30b which is provided so as to be common with respect to the plurality of the light emitting elements E.

Figure 5:
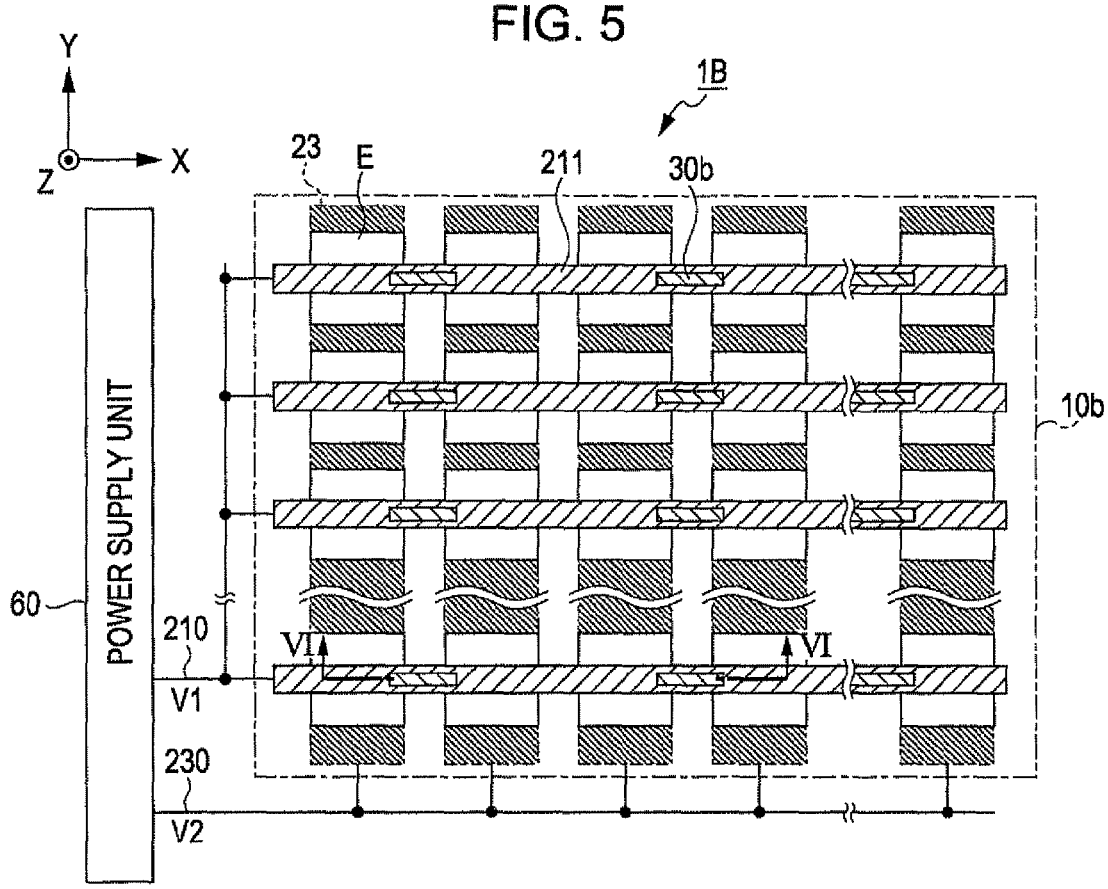
FIG. 5 is a plan view which shows a lighting device according to a second embodiment of the invention.

FIG. 5 is a plan view which shows the lighting device 1B according to the second embodiment. As shown in FIG. 5, the lighting device 1B has the lighting unit 10b which includes the fuse unit 30b which is commonly provided with respect to two neighboring light emitting elements E which are provided corresponding to the same supporting electrode 211.

Figure 6:
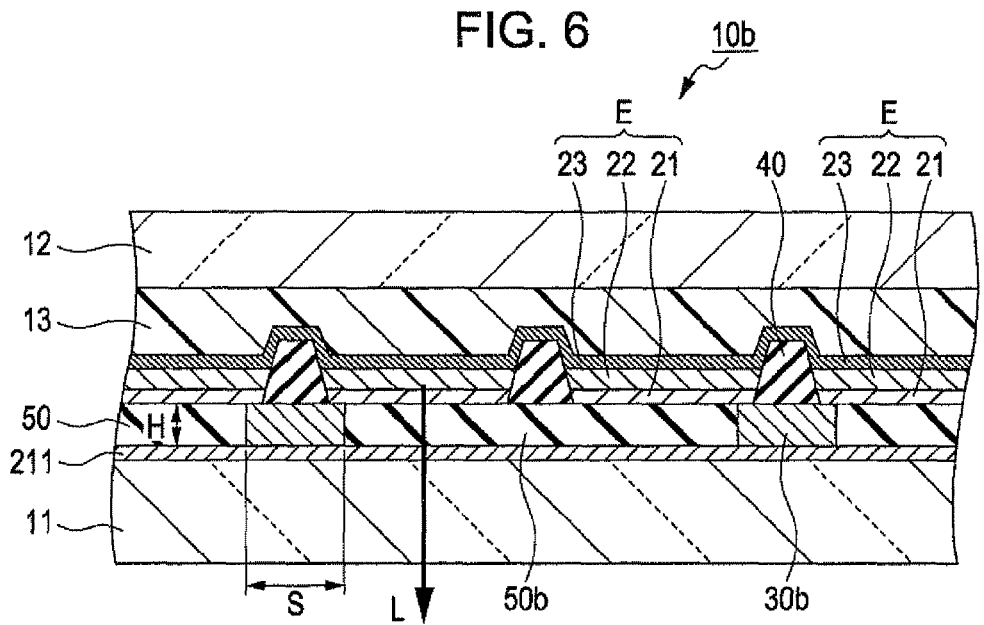
FIG. 6 is a cross-sectional view which shows a structure of the lighting device according to the second embodiment of the invention.

FIG. 6 is a cross-sectional view of the lighting device 1B shown in FIG. 5 which is cut along line VI-VI. As shown in FIG. 6, the fuse unit 30b is provided on the supporting electrode 211, and is electrically connected to two neighboring first electrodes 21 and the supporting electrode 211.

In addition, in order to make a resistance value of the fuse unit 30b high, the fuse unit 30b is formed to have a small cross-sectional area S, by forming the depth (the length of a side parallel to the Y axis of the fuse unit 30b in FIG. 5) of the fuse unit sufficiently short.

Further, as shown in FIG. 6, most part of the fuse unit 30b is formed below the first partitioning wall 40, not at a position which is covered with the light emitting element E when seen from the direction perpendicular to the first substrate 11. That is, it is possible to make a ratio in which light emitted to the direction L from the light emitting element E is obstructed by the fuse unit 30 small. Accordingly, the fuse unit 30b is not necessarily formed of a material with optical transparency such as polysilicon and ITO, and it is possible to form the fuse unit of low melting point metal with no optical transparency.

In addition, according to the second embodiment, the arrangement of the fuse unit 30b is not limited to the direction where the long side of the fuse unit 30b is parallel to the X axis, as shown in FIG. 5.

Figure 7:
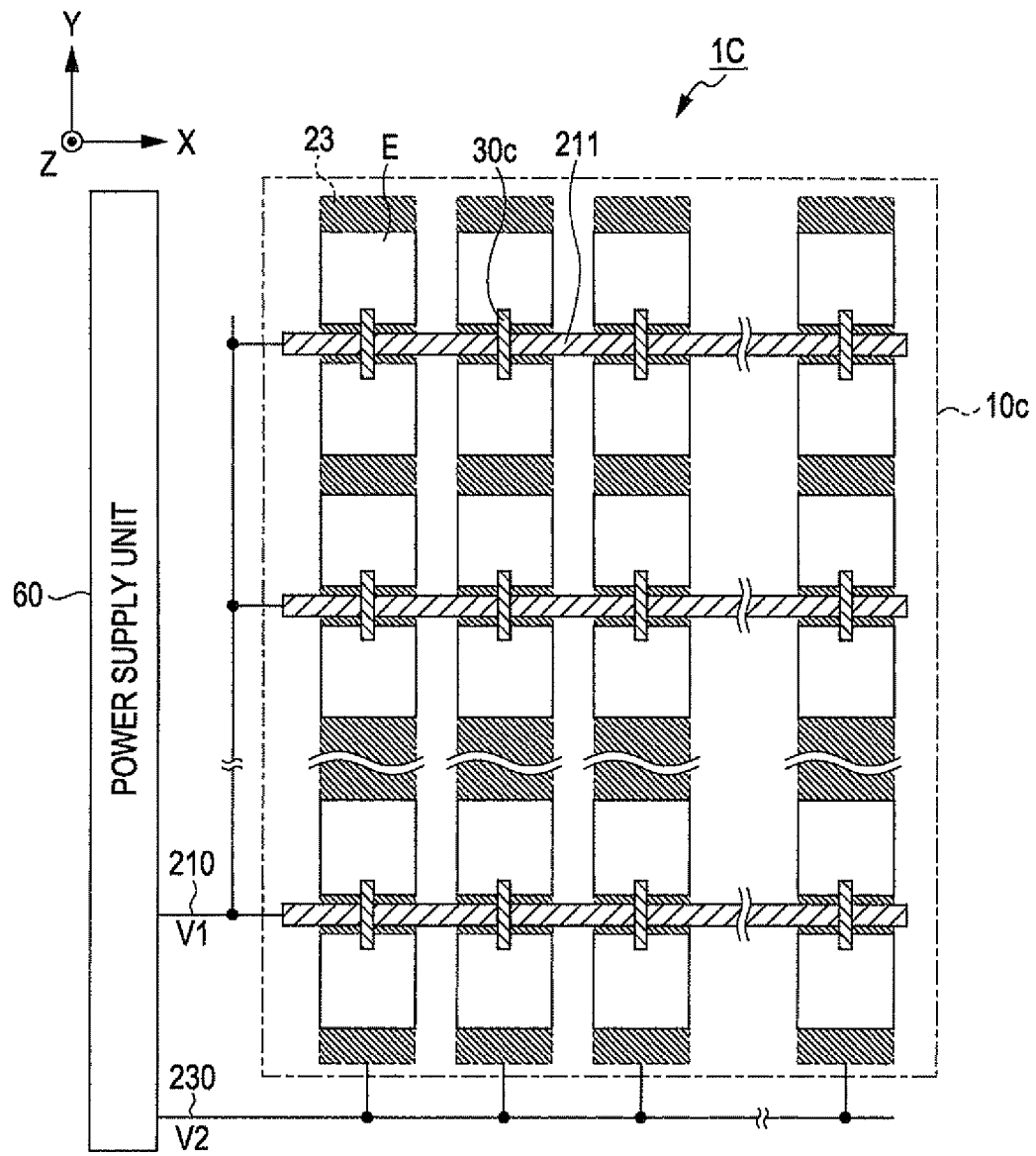
FIG. 7 is a plan view which shows the lighting device according to a modified example of the second embodiment of the invention.

For example, like a lighting unit 10c of lighting device 1C shown in FIG. 7, the fuse unit 30c may be arranged in the direction in which the long side of a fuse unit 30c is parallel to the Y axis. In this case, the fuse unit 30c is commonly provided with respect to two neighboring light emitting elements E which are connected to the same second electrode 23.

In addition, in FIGS. 5 and 7, the fuse units 30b to 30c are provided to be common to two neighboring light emitting elements, however, the fuse units 30b and 30c may be provided to be common to three or more light emitting elements E. However, in such a case, when one fuse unit 30b to one fuse unit 30c are fused, the plurality of light emitting elements E which is connected to the fuse is not able to emit light at the same time. Accordingly, it is preferable that the number of light emitting elements E which is connected with respect to the one fuse unit 30b to one fuse unit 30c be below a certain number, in order to maintain the function of the lighting units 10b to 10c as the surface light source.

In this manner, in the second embodiment, it is possible to simplify the manufacturing process, since one fuse unit 30b to one fuse unit 30c is commonly provided with respect to the plurality of light emitting elements E, accordingly, there is an advantage that it is possible to realize cost reductions in the lighting device 1.

In addition, most part of the fuse unit 30b to the fuse unit 30c are formed at a position where they are not overlapped with the light emitting element E when seen from the direction perpendicular to the first substrate 11. In this case, since the ratio of light which passes through the fuse unit 30b to the fuse unit 30c among light beams which are emitted with respect to the direction L from the light emitting element E, there is an advantage that it is possible to increase luminous efficiency of the lighting device 1. In addition, since the material of the fuse unit 30b to the fuse unit 30c is not limited to a material with optical transparency, it has the advantage that manufacturing costs can be reduced.

C: Third Embodiment

Lighting device 1D according to a third embodiment has the same configuration as that of the lighting device 1 according to the first embodiment, except that a fuse unit 30d is provided on a second substrate side, a first electrode 21d is provided on the second substrate side of a light emitting functional layer 22 and functions as a cathode, a second electrode 23d is provided on a first substrate side of the light emitting functional layer 22 and functions as an anode.

Figure 8:
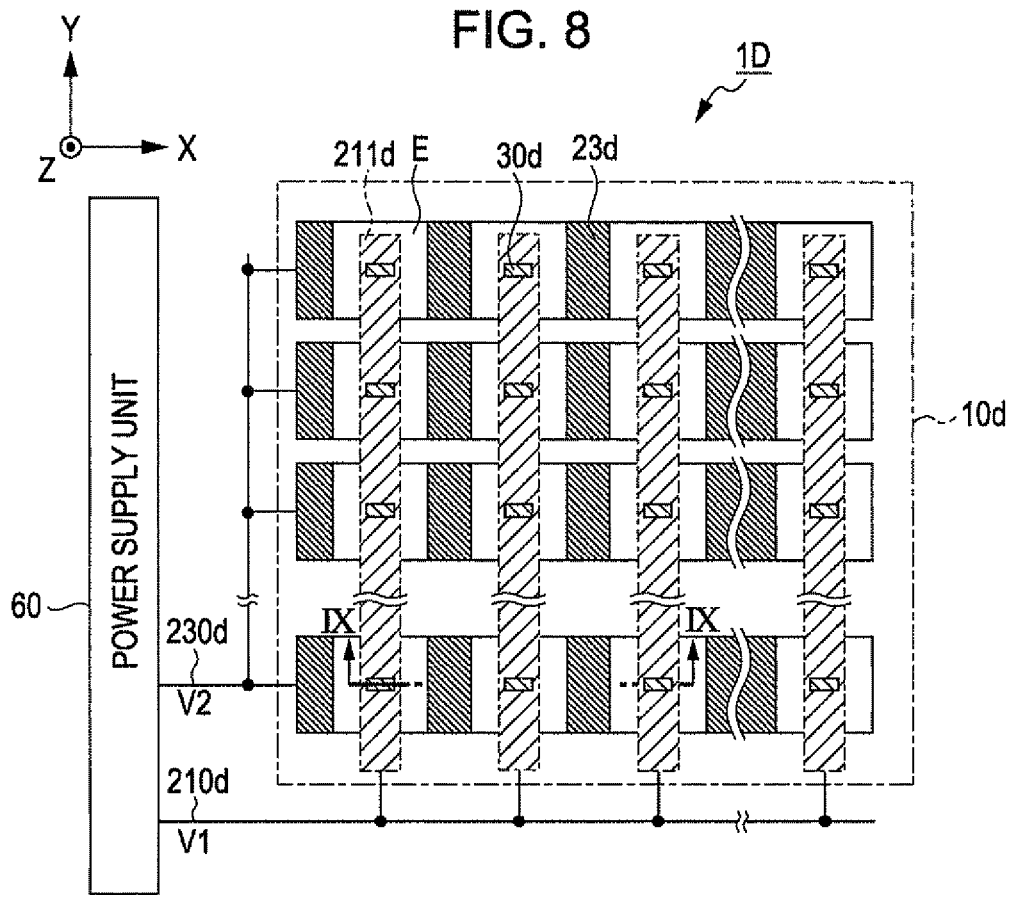
FIG. 8 is a plan view which shows a lighting device according to a third embodiment of the invention.

FIG. 8 is a plan view which shows the lighting device 1D according to the third embodiment. As shown in FIG. 8, the lighting device 1D has a lighting unit 10d. In the lighting unit 10d, M second electrodes 23d which extend in the X direction, N supporting electrodes 211d which extend in the Y direction which intersects the X direction, and light emitting elements E which are arranged in matrix of vertical M rows x horizontal N rows (M and N are natural numbers of one or more) are formed corresponding to the intersection of the M second electrodes 23d and the N supporting electrodes 211d.

A power supply unit 60 supplies a first electric potential V1 to the supporting electrode 211d through a first power line 210d, and supplies a second electric potential V2 to the second electrode 23d through a second power line 230d. According to the third embodiment, the first electric potential V1 is set to a low electric potential VL, and the second electric potential V2 is set to a high electric potential VH.

Figure 9:
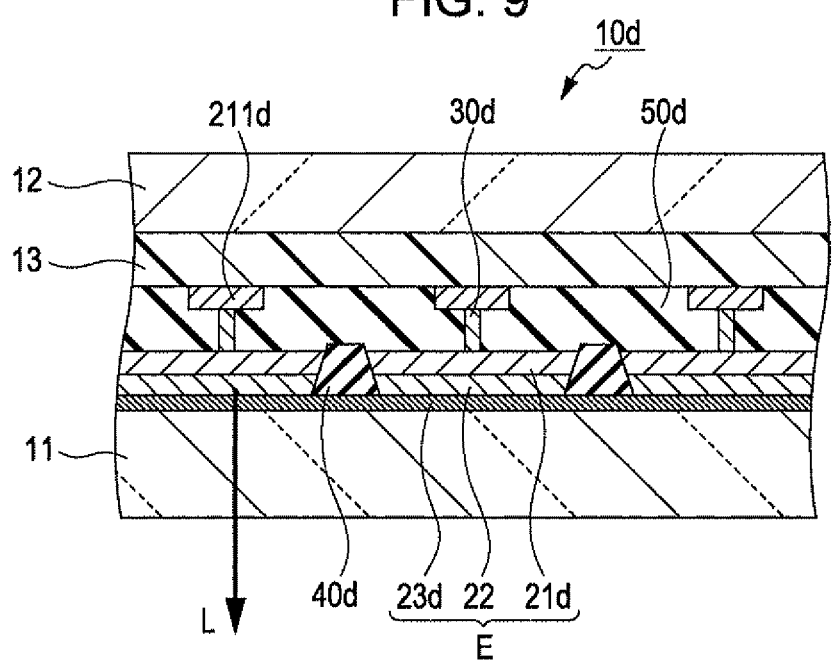
FIG. 9 is a cross-sectional view which shows a structure of the lighting device according to the third embodiment of the invention.

FIG. 9 is a cross-sectional view of the lighting unit 10d which is cut along line IX-IX shown in FIG. 8.

The second electrode 23d is formed on the first substrate 11 so as to be common to N light emitting elements E which extend in the X direction. The second electrode 23d is formed of a conductive oxide material with optical transparency such as ITO (indium tin oxide), IZO (indium zinc oxide), or $ZnO_2$. As described above, the second electrode 23d is supplied with the high electric potential VH, and functions as the anode of the light emitting element E.

The light emitting functional layer 22 which is separated by a first partitioning wall 40d is formed on the second electrode 23d. The first electrode 21d which is separated by the first partitioning wall 40d is formed on the light emitting functional layer 22. The first electrode 21d is formed of a reflective metal material with small value of work function such as aluminum or silver. The first electrode 21d is supplied with the low electric potential VL to through the fuse unit 30d which will be described later, and functions as the cathode of the light emitting element E. In addition, the first electrode 21d also functions as a reflective plate which reflects light, which is emitted from the light emitting functional layer 22 in the opposite direction to the direction L, in the direction L which goes toward the first substrate 11.

In addition, the first partitioning wall 40d is formed of an insulating material. Further, it is preferable that the first partitioning wall 40d be formed of a reflective material or a light blocking material in order to cause light which is emitted from the light emitting functional layer 22 to go toward the direction L as much as possible.

M×N fuse units 30d which are separated by an insulating second partitioning wall 50 is formed on the first electrode 21d in a one-to-one correspondence with the light emitting elements E. The fuse unit 30d may be configured by low melting point metal, and may be formed of aluminum or silver similarly to the first electrode 21d and the supporting electrode 211d.

The supporting electrode 211d which is separated by the second partitioning wall 50d is formed on the fuse unit 30d and the second partitioning wall 50d. The supporting electrode 211d is formed of a conductive metal such as aluminum or silver.

In this manner, according to the third embodiment, the fuse unit 30d, the supporting electrode 211d, and the first electrode 21d which functions as the cathode are provided on the second substrate side of the light emitting functional layer 22, that is, the opposite side to the direction L where light is emitted from the light emitting element E. The second electrode 23d which functions as the anode is provided on the first substrate side of the light emitting functional layer 22, that is, in the direction L where the light is emitted from the light emitting element E.

Figure 10:
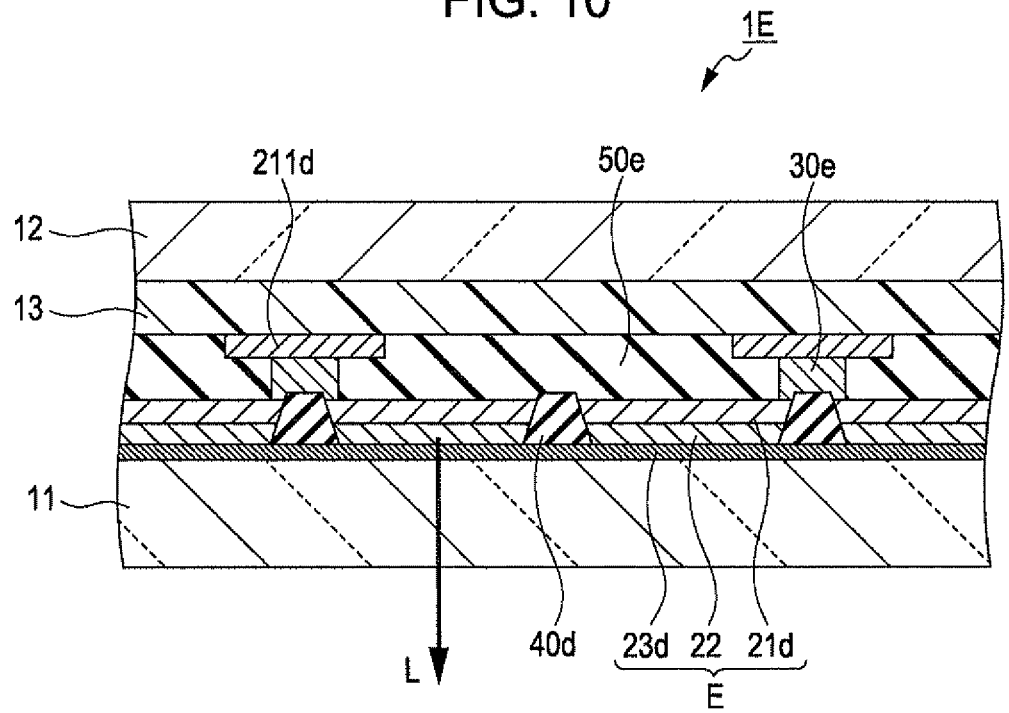
FIG. 10 is a cross-sectional view which shows a structure of the lighting device according to the third embodiment of the invention.

In addition, the lighting device 1D according to the third embodiment is formed with a one-to-one correspondence between the fuse units 30d and the light emitting elements E, as shown in FIGS. 8 and 9, however, the invention is not limited to such a configuration. That is, the invention may include a lighting unit 10e having a fuse unit 30e which is provided to be common to the plurality of light emitting elements E, similarly to lighting device 1E shown in FIG. 10.

In this manner, in the lighting device 1D according to the third embodiment, since the fuse unit 30d is formed on the second substrate side rather than the light emitting functional layer 22, it is possible to make the distance from the light emitting functional layer 22 to the first substrate 11 to which the light is emitted short and it is possible to prevent the light from being reflected, refracted, or the like, by the fuse unit 30d. Accordingly, there is an advantage that it is possible to raise an extraction efficiency of the light, and to reduce power consumption, as a result, in the lighting device 1D according to the third embodiment.

In addition, in the lighting device 1D according to the third embodiment, since it is not necessary to limit the material of the fuse unit 30d to a material of optical transparency, there is an advantage that it is possible to select an inexpensive material such as a low melting point metal or the like, and to reduce the cost of the lighting device 1D.

D: Application

Figure 11:
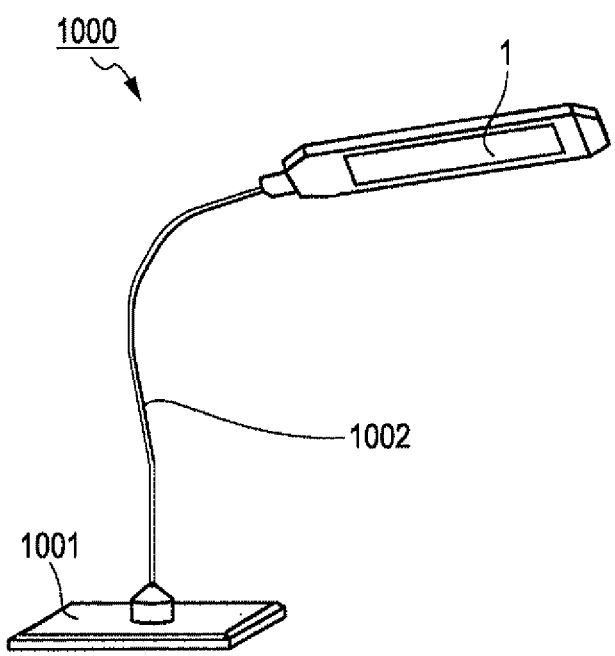
FIG. 11 is a perspective view which shows the appearance of a lamp which has the lighting device according to embodiments of the invention.
Figure 12:
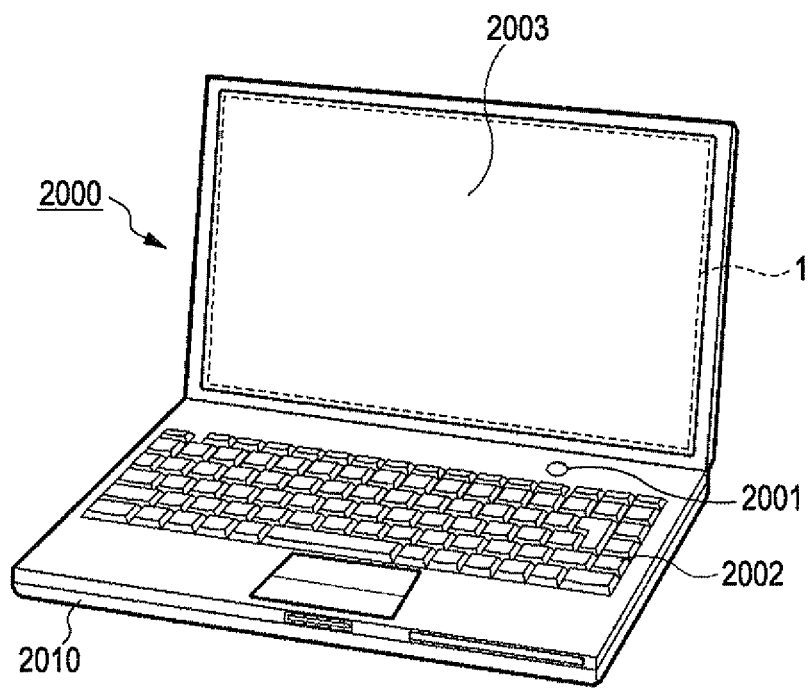
FIG. 12 is a perspective view which shows the appearance of a computer which has the lighting device according to embodiments of the invention.
Figure 13:
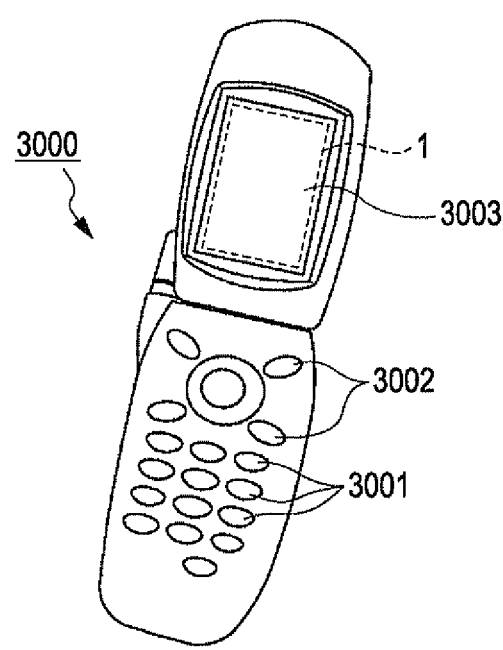
FIG. 13 is a perspective view which shows the appearance of a mobile phone which has the lighting device according to embodiments of the invention.

Next, an electronic apparatus in which the lighting device 1 according to each of the above described embodiments will be described. FIG. 11 to FIG. 13 shows a embodiment the electronic apparatus to which the lighting device 1 is adopted.

FIG. 11 is a perspective view of a lamp to which the lighting device 1 is adopted. The lamp 1000 includes a pedestal 1001, a connection unit 1002, and the lighting device 1.

FIG. 12 is a perspective view which shows a configuration of a mobile personal computer to which the lighting device 1 is adopted. The personal computer 2000 includes a display unit 2003 which displays various images, and a main body 2010 in which a power switch 2001 or a key board 2002 is provided. The display unit 2003 is configured by a liquid crystal display device, and planar lighting device 1 is used as a backlight for the liquid crystal display device.

FIG. 13 is a perspective view which shows a configuration of a mobile phone to which the lighting device 1 is adopted. The mobile phone 3000 includes a plurality of operation buttons 3001, a scroll button 3002, and a display unit 3003 which displays various images. The display unit 3003 is configured by a liquid crystal display device, and the planar lighting device 1 is used as the backlight of the liquid crystal display device. By operating the scroll button 3002, a screen which is displayed on the display unit 3003 is scrolled.

In addition, as electronic apparatuses to which the lighting device according to the embodiment of the invention, for example, there are a digital still camera, a television, a video camera, a car navigation system, a pager, an electronic organizer, electronic paper, a calculator, a word-processor, a work station, a TV phone, a POS terminal, a printer, a scanner, a copy machine, a video player, a device with a touch panel, or the like, in addition to the apparatuses exemplified in FIGS. 11 to 13.

This application claims priority to Japanese Patent Application No. 2010-284263 filed on Dec. 21, 2010. The entire disclosure of Japanese Patent Application No. 2010-284263 is hereby incorporated herein by reference.

What is claimed is:

1. A lighting device having a plurality of light emitting elements, the lighting device comprising:
   a first substrate;
   a supporting electrode to which a first source electric potential is supplied;
   a plurality of light emitting functional layers;
   a plurality of first electrodes;
   a second electrode to which a second source electric potential is supplied;
   a plurality of fuse units, one of the plurality of fuse units electrically connecting one of the first electrodes and the supporting electrode;
   an insulating first partitioning wall which separates each of the plurality of light emitting functional layers from each other, and separates each of the plurality of first electrodes from each of the plurality of light emitting elements; and
   an insulating second partitioning wall which separates each of the plurality of fuse units.

2. The lighting device according to claim 1,
   wherein each of the plurality of fuse units is formed on the supporting electrode in a one-to-one correspondence with each of the plurality of first electrodes.

3. The lighting device according to claim 2,
   wherein all of the plurality of fuse units are overlapped with one of the plurality of light emitting functional layers when seen from a direction which is perpendicular to the first substrate.

4. An electronic apparatus according to claim 3, comprising the lighting device.

5. An electronic apparatus according to claim 2, comprising the lighting device.

6. The lighting device according to claim 1,
   wherein each of the plurality of fuse units is formed on the supporting electrode corresponding to two or more light emitting elements of the plurality of light emitting elements.

7. An electronic apparatus according to claim 6, comprising the lighting device.

8. The lighting device according to claim 1,
   wherein the plurality of fuse units, the supporting electrode, and the plurality of first electrodes are formed of the same material.

9. An electronic apparatus according to claim 8, comprising the lighting device.

10. The lighting device according to claim 1,
    wherein the first substrate, the supporting electrode, the second partitioning wall, and the plurality of first electrodes are formed of a light transmissive material.

11. The lighting device according to claim 10,
    wherein the plurality of fuse units is formed of the light transmissive material.

12. An electronic apparatus according to claim 11, comprising the lighting device.

13. An electronic apparatus according to claim 10, comprising the lighting device.

14. The lighting device according to claim 1,
    wherein the first substrate and the second electrode are formed of the light transmissive material.

15. An electronic apparatus according to claim 14, comprising the lighting device.

16. The lighting device according to claim 1,
wherein the plurality of light emitting elements is connected to the supporting electrode in parallel.

17. An electronic apparatus according to claim 16, comprising the lighting device.

18. An electronic apparatus according to claim 1, comprising a lighting device.

* * * * *